US012563929B2

(12) United States Patent
Wang et al.

(10) Patent No.: US 12,563,929 B2
(45) Date of Patent: Feb. 24, 2026

(54) DISPLAY SUBSTRATE AND DISPLAY DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Ge Wang, Beijing (CN); Zhiliang Jiang, Beijing (CN); Qingqing Yan, Beijing (CN); Xiangnan Pan, Beijing (CN); Qing He, Beijing (CN); Xiaomin Yuan, Beijing (CN); Zaiyong Long, Beijing (CN); Min Chen, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 401 days.

(21) Appl. No.: 18/262,468

(22) PCT Filed: Sep. 28, 2022

(86) PCT No.: PCT/CN2022/122025
§ 371 (c)(1),
(2) Date: Jul. 21, 2023

(87) PCT Pub. No.: WO2023/098264
PCT Pub. Date: Jun. 8, 2023

(65) Prior Publication Data
US 2024/0081111 A1 Mar. 7, 2024

(30) Foreign Application Priority Data
Dec. 2, 2021 (CN) .......................... 202111459435.9

(51) Int. Cl.
*H10K 59/131* (2023.01)
*H10K 59/80* (2023.01)

(52) U.S. Cl.
CPC ......... *H10K 59/131* (2023.02); *H10K 59/874* (2023.02)

(58) Field of Classification Search
CPC .. H10K 59/131; H10K 59/123; H10K 59/124; H10K 59/873; H10D 86/00; H10D 86/451; H10D 86/60; H10D 86/441
See application file for complete search history.

(56) References Cited

U.S. PATENT DOCUMENTS 10,707,282 B1* 7/2020 Yang .................... H10K 59/122
2020/0042123 A1 2/2020 Kim et al.
(Continued)

FOREIGN PATENT DOCUMENTS

CN 109300913 A 2/2019
CN 110265576 A 9/2019
(Continued)

*Primary Examiner* — Thanhha S Pham
(74) *Attorney, Agent, or Firm* — BROOKS KUSHMAN P.C.

(57) ABSTRACT

A display substrate and a display device. The display substrate includes a base, an insulating layer, a crack barrier structure, and a signal line. The crack barrier structure is located in a peripheral area, and at least a part of an orthographic projection of the crack barrier structure onto the base extends in an extension direction of a boundary of a display area. The crack barrier structure includes: a groove structure and a blocking portion, the groove structure is in the insulating layer, and a part of the blocking portion is located in the groove structure. The signal line is located at the peripheral area, and includes a top surface facing away from the base, and a side surface located between the top surface and the base, and at least a part of the side surface (Continued)

away from the display area is between the blocking portion and the groove structure.

19 Claims, 5 Drawing Sheets

(56)                    References Cited

U.S. PATENT DOCUMENTS

| | | |
|---|---|---|
| 2020/0111857 A1 | 4/2020 | Moon et al. |
| 2020/0135835 A1 | 4/2020 | Seo et al. |
| 2021/0226167 A1 | 7/2021 | Zhang |

FOREIGN PATENT DOCUMENTS

| | | | |
|---|---|---|---|
| CN | 110797375 | A | 2/2020 |
| CN | 111009548 | A | 4/2020 |
| CN | 111106145 | A | 5/2020 |
| CN | 111583808 | A | 8/2020 |
| CN | 111900265 | A | 11/2020 |
| CN | 112635689 | A | 4/2021 |
| CN | 112885844 | A | 6/2021 |
| CN | 114122021 | A | 3/2022 |
| CN | 216749900 | U | 6/2022 |
| KR | 20190031042 | A | 3/2019 |

* cited by examiner

DISPLAY SUBSTRATE AND DISPLAY DEVICE

CROSS-REFERENCE TO RELATED APPLICATIONS

This application is the U.S. national phase application of a PCT Application No. PCT/CN2022/122025 filed on Sep. 28, 2022, which claims priority to Chinese Patent Application No. 202111459435.9 filed on Dec. 2, 2021, which are hereby incorporated by reference in their entireties.

TECHNICAL FIELD

The present disclosure relates to the technical field of display, and more particularly, to a display substrate, and a display device.

BACKGROUND

The organic light-emitting diode (OLED) display panel has been widely used in various fields owing to its advantages such as light weight and thinness, high brightness, low power consumption, fast response, high definition, good flexibility and high luminous efficiency. However, although the OLED display panel has many advantages as mentioned above, there is still a problem that the bezel of the display panel is wide, and the wide bezel of the display panel will impact user experience, so how to realize the narrow bezel of the display panel becomes an urgent problem to be solved.

SUMMARY

A first aspect of the present disclosure provides a display substrate including a base, the base including a display area and a peripheral area located at the periphery of the display area; wherein the display substrate further includes:

an insulating layer located at the peripheral area;

a crack barrier structure located at the peripheral area, wherein at least a part of an orthographic projection of the crack barrier structure onto the base extends along an extension direction of a boundary of the display area; the crack barrier structure includes: a groove structure and a blocking portion, the groove structure being located in the insulating layer, and a part of the blocking portion being located in the groove structure; and a signal line located at the peripheral area, wherein the signal line includes a top surface facing away from the base, and a side surface located between the top surface and the base, and at least a part of the side surface away from the display area is located between the blocking portion and the groove structure.

Optionally, the signal line includes a first electrically conductive layer and a second electrically conductive layer which are arranged in different layers, and the first electrically conductive layer is coupled to the second electrically conductive layer;

at least a part of a side surface included by at least one of the first electrically conductive layer or the second electrically conductive layer that is away from the display area is located between the blocking portion and the groove structure, the side surface being covered by the blocking portion.

Optionally, the display substrate further includes a dam structure located at the peripheral area, the dam structure surrounds the display area, and at least a part of an orthographic projection of the dam structure onto the base is located between the orthographic projection of the crack barrier structure onto the base and the display area;

a minimum distance between a boundary of the orthographic projection of the dam structure onto the base close to the display area and a boundary of the orthographic projection of the dam structure onto the base away from the display area is less than or equal to 110 μm.

Optionally, the dam structure includes at least one dam surrounding the display area.

Optionally, the dam structure includes: a first dam and a second dam, the first dam surrounding the display area, and the second dam surrounding the first dam.

Optionally, one of the first dam and the second dam includes a first dam part, a second dam part, a third dam part, and a fourth dam part coupled in sequence;

the first dam part is located at a lower bezel of the display substrate, the first dam part includes a first dam portion and a second dam portion with the same extension direction, the first dam portion is located between the second dam portion and the display area, a first end of the first dam portion is coupled to a first end of the second dam portion, and a second end of the first dam portion is coupled to a second end of the second dam portion.

Optionally, a minimum first distance d1 between a boundary of an orthographic projection of the first dam onto the base close to the display area and a boundary of an orthographic projection of the second dam onto the base away from the display area satisfies: 70 μm≤d1≤110 μm.

Optionally, the signal line includes a first electrically conductive layer and a second electrically conductive layer which are arranged in different layers, and the first electrically conductive layer is coupled to the second electrically conductive layer; the side surface of the first electrically conductive layer away from the display area is covered by the blocking portion, and a side surface of the second electrically conductive layer away from the display area is covered by one dam.

Optionally, at least a part of the first electrically conductive layer is located between the second electrically conductive layer and the base.

Optionally, the first electrically conductive layer is made of a first source-drain metal layer, and the second electrically conductive layer is made of a second source-drain metal layer.

Optionally, at least a part of the signal line is located in the groove structure.

Optionally, the groove structure includes at least two grooves arranged in sequence in a direction away from the display area, and at least a part of an orthographic projection of the grooves onto the base extends in an extension direction of the boundary of the display area;

the at least two grooves include at least one target groove and at least one non-target groove, the at least one target groove being closer to the display area;

at least a part of the signal line is located in the at least one target groove;

a part of the blocking portion is located in the at least one target groove and the at least one non-target groove.

Optionally, the groove structure includes at least two grooves arranged in sequence in a direction away from the display area, and at least a part of an orthographic projection of the grooves onto the base extends in an extension direction of the boundary of the display area;

at least a part of the signal line is located in each groove, and a part of the blocking portion is located in each groove;

an orthographic projection of the at least a part of the side surface onto the base is between an orthographic projection of a boundary of the blocking portion away from the display area onto the base and the display area.

Optionally, the signal line includes a first electrically conductive layer and a second electrically conductive layer which are arranged in different layers, and the first electrically conductive layer is coupled to the second electrically conductive layer;

the at least a part of the signal line includes the first electrically conductive layer.

Optionally, the signal line includes a first electrically conductive layer and a second electrically conductive layer which are arranged in different layers, and the first electrically conductive layer is coupled to the second electrically conductive layer;

the at least a part of the signal line includes the first electrically conductive layer and the second electrically conductive layer.

Optionally, the blocking portion is made of at least one of a first planarization layer or a second planarization layer.

Optionally, the signal line includes at least one of a positive power supply line or a negative power supply line.

Optionally, the negative power supply line includes:

an annular portion semi-enclosing the display area, the annular portion including the first electrically conductive layer and the second electrically conductive layer;

two line inlet portions coupled in one-to-one correspondence to two end portions of the annular portion.

Optionally, the display substrate further includes a driving chip, the driving chip is located at the peripheral area of the display substrate, and the driving chip is coupled to the two line inlet portions;

the annular portion includes a first end portion, a second end portion, and a connecting portion connected between the first end portion and the second end portion, the connecting portion extending along the boundary of the display area; the first end portion and the second end portion are coupled to the two line inlet portions in one-to-one correspondence; the connecting portion includes the first electrically conductive layer and the second electrically conductive layer.

Based on the technical solution of the display substrate, a second aspect of the present disclosure provides a display device including the above-mentioned display substrate.

BRIEF DESCRIPTION OF THE DRAWINGS

The accompanying drawings, which are included to provide a further understanding of the present disclosure, are incorporated in and constitute a part of the present disclosure. Illustrative embodiment(s) of the present disclosure and related descriptions serve to explain the disclosure and do not constitute an undue limitation on the disclosure. In the drawings.

DETAILED DESCRIPTION

Figure 1:
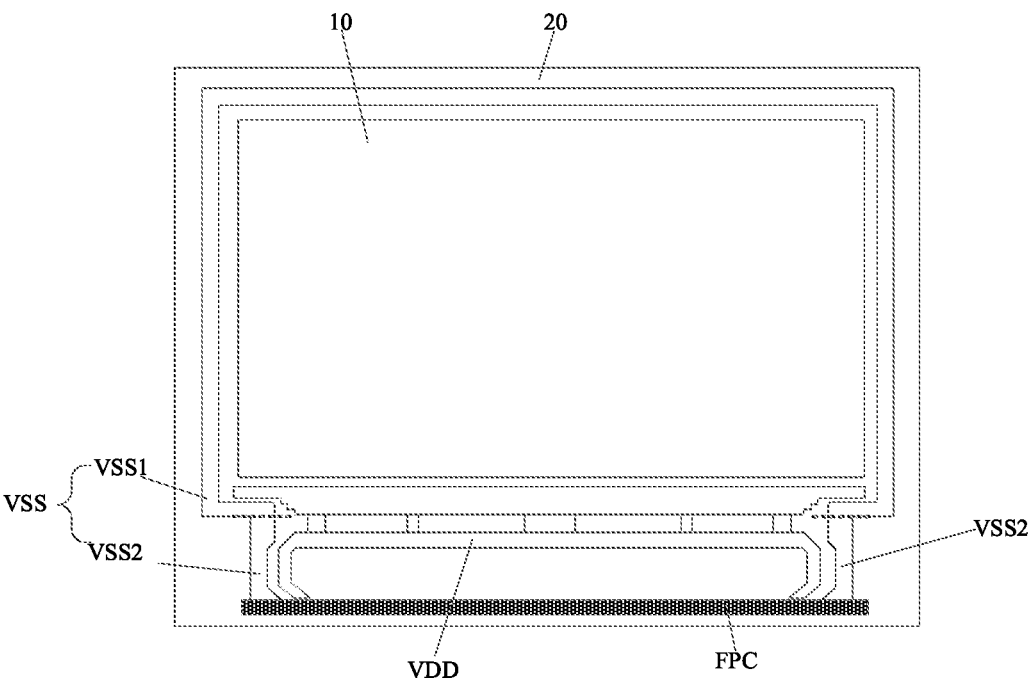
FIG. 1 is a basic structure diagram of a display substrate according to an embodiment of the present disclosure.

In order to further explain the display substrate and the display device provided by the embodiments of the present disclosure, a detailed description will be given below with reference to the accompanying drawings.

Research has revealed that the current way to achieve a narrow display panel bezel mainly includes reducing the width of the dam located in the peripheral area of the display panel. However, the edge of some of the signal lines in the peripheral area of the display panel needs to be covered by a dam, and reducing the width of the dam tends to expose the signal lines, putting the signal lines at risk of corrosion. Furthermore, if the signal lines are considered to be narrowed at the same time, the input signal strength of the signal lines may be insufficient, so that the display uniformity of the display panel may be deteriorated.

Therefore, how to achieve a narrow bezel of the display panel while avoiding corrosion of the signal lines around the display panel and ensuring the strength of the signals transmitted by the signal lines remains an urgent problem.

With reference to FIG. 1 and FIG. 3 to FIG. 8, an embodiment of the present disclosure provides a display substrate, including a base 60, wherein the base 60 includes a display area 10 and a peripheral area 20 located at the periphery of the display area; the display substrate further includes:

an insulating layer 70, the insulating layer 70 being located at the peripheral area 20;

a crack barrier structure 30 located at the peripheral area 20, wherein at least a part of an orthographic projection of the crack barrier structure 30 onto the base 60 extends in an extension direction of a boundary of the display area 10; the crack barrier structure 30 includes: a groove structure and a blocking portion 302, wherein the groove structure is located in the insulating layer 70, and a part of the blocking portion 302 is located in the groove structure;

a signal line (e.g., including a first electrically conductive layer 41 and a second electrically conductive layer 42), wherein the signal line is located at the peripheral area 20, the signal line includes a top surface facing away from the base 60, and a side surface located between the top surface and the base 60, and at least a part of the side surface away from the display area 10 is located between the blocking portion 302 and the groove structure.

Illustratively, the peripheral area 20 at least partially surrounds the display area 10.

Illustratively, the base 60 includes a flexible substrate.

Illustratively, the display area 10 includes a rectangular display area or an irregular display area, and the peripheral area 20 surrounds the display area. It is noted that the irregular display area refers to that a shape of the display area is not a regular quadrangle, for example, the shape of the display area is circular.

Illustratively, in a fabrication process of the display substrate, a display motherboard that includes a plurality of display substrates is firstly fabricated, and after the display motherboard is completed, the display motherboard undergoes a dicing process to obtain a plurality of independent display substrates.

Since the dicing process tends to cause cracks at the edge of the display substrate, the cracks may propagate into the interior of the display substrate by using an inorganic layer in the display substrate as a transmission path, affecting the yield of the display substrate. Thus, the crack barrier structure 30 is provided at a region of the peripheral area 20 of the display substrate close to the edge of the display substrate, so as to prevent the cracks from propagating towards the interior of the display substrate.

Illustratively, the insulating layer 70 includes at least one of inorganic insulating layers, such as a gate insulating layer and an interlayer insulating layer.

Illustratively, at least a part of an orthographic projection of the crack barrier structure 30 onto the base 60 extends in the extension direction of the boundary of the display area 10, and can prevent cracks anywhere along the edge of the display substrate from propagating into the interior of the display substrate.

Illustratively, at least a part of an orthographic projection of the groove structure onto the base 60 extends in the extension direction of the boundary of the display area 10.

Illustratively, at least a part of an orthographic projection of the blocking portion 302 onto the base 60 extends in the extension direction of the boundary of the display area 10.

Illustratively, the crack barrier structure 30 at least partially surrounds the display area 10.

Illustratively, the groove structure at least partially surrounds the display area 10.

Illustratively, the blocking portion 302 at least partially surrounds the display area 10.

Illustratively, the depth of the groove structure is greater than or equal to the thickness of the insulating layer 70 in a direction perpendicular to the base 60. Illustratively, the groove structure penetrates through the insulating layer 70.

Illustratively, a portion of the blocking portion 302 is located in the groove structure, and another portion of the blocking portion 302 is located outside the groove structure.

Illustratively, the at least a part of the side surface is located between the blocking portion 302 and the groove structure, and the at least a part of the side surface is covered by the blocking portion 302.

Illustratively, the signal line is made of a metal material.

Illustratively, the signal line is made of a metal oxide material, for example, indium tin oxide (ITO).

Illustratively, the signal line includes a bottom surface facing the base 60, a top surface facing away from the base 60, and a side surface between the top surface and the base 60. The side surface includes: a side surface close to the display area 10, and a side surface away from the display area 10.

Illustratively, the signal line includes a plurality of metal layers arranged in a stack. For example: a Ti metal layer, an Al metal layer and a Ti metal layer which are arranged in a stack. If the Al metal layer on the side surface of the signal line is exposed, during the subsequent fabrication of the anode layer in the display substrate, the etching solution of the anode layer may corrode the Al metal layer, affecting the fabrication yield of the signal line.

Figure 3:
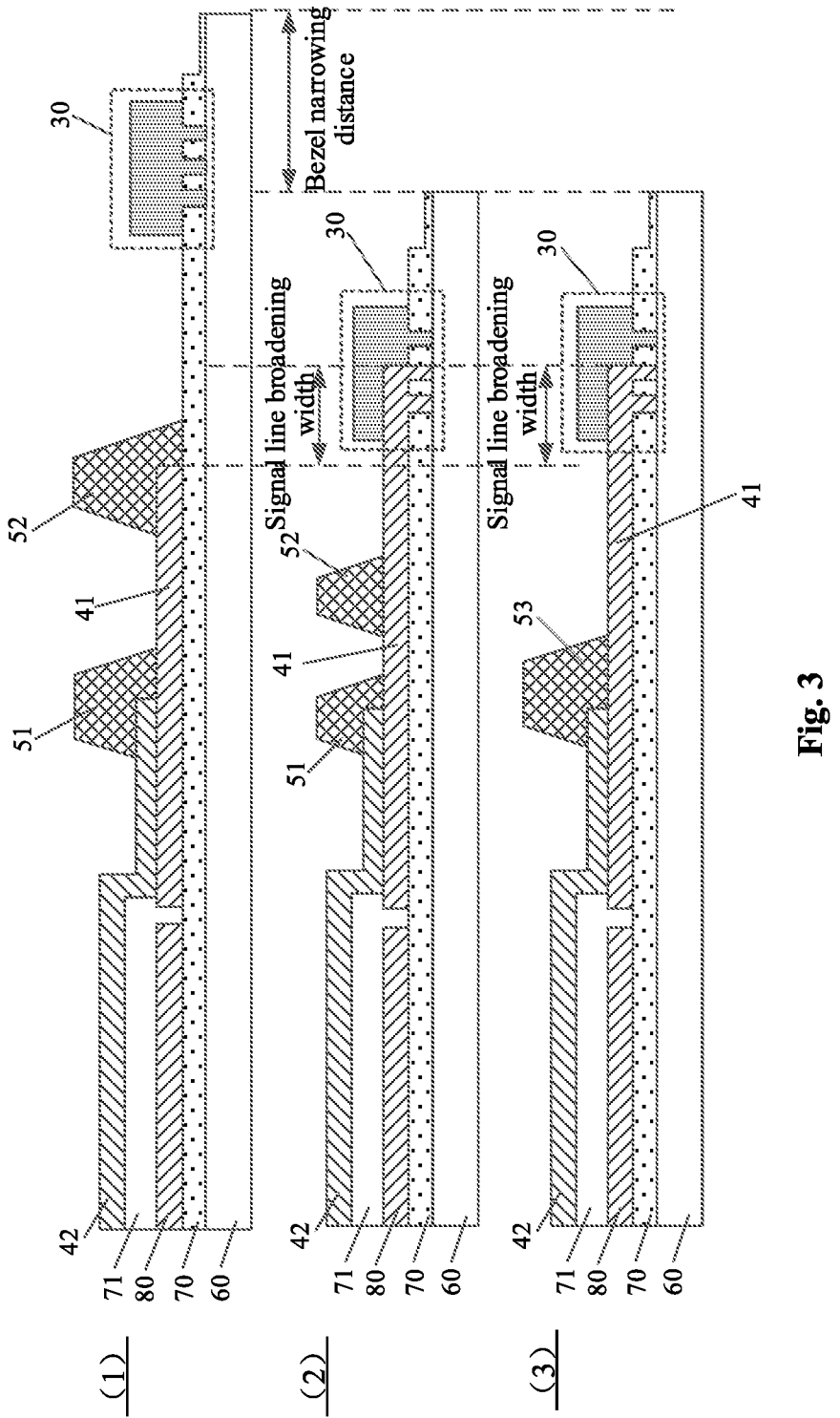
FIG. 3 is a schematic diagram showing a comparison between a layout of a signal line according to an embodiment of the present disclosure and a layout of a signal line in the related art.

It should be noted that, the first section (1) in FIG. 3 is a schematic diagram showing the layout of the right bezel of the display substrate when the signal line does not extend to the crack barrier structure 30. The second section (2) and the third section (3) in FIG. 3 are schematic layout diagrams of the right bezel of the display substrates according to embodiments of the present disclosure.

Illustratively, the bezel narrowing distance in FIG. 3 is greater than or equal to 200 microns. The signal line broadening width is between 20 microns and 30 microns inclusive.

According to the specific structure of the display substrate provided by the embodiments of the present disclosure, it can be seen that in the display substrate provided by the embodiments of the present disclosure, at least a part of the side surface of the signal line away from the display area 10 is arranged between the blocking portion 302 and the groove structure, so that at least a part of the side surface of the signal line can be located in the groove structure, and the blocking portion 302 can better cover the side surface of the signal line, thereby reducing the risk of corrosion on the side surface of the signal line.

In the display substrate according to embodiments of the present disclosure, the signal line extends to the vicinity of the crack barrier structure 30, and at least a part of the side surface of the signal line away from the display area 10 is arranged to be covered by the crack barrier structure 30.

Since at least a part of the side surface of the signal line is covered by the crack barrier structure 30, the risk of corrosion of the signal line during the manufacturing process of the display substrate is reduced, and the yield of signal line is guaranteed. Furthermore, extending the signal line to the vicinity of the crack barrier structure 30 can effectively increase the wiring width of the signal line, reduce the voltage drop over the signal line when transmitting signals, and ensure that signals inputted to the display area 10 via the signal line have a high strength, thereby ensuring the display uniformity of the display panel, and improving the operation performance of the display substrate.

In addition, since at least a part of the side surface of the signal line is covered by the crack barrier structure 30, the size of the dam structure of the display substrate for blocking the organic encapsulation layer can be reduced, thereby better realizing the narrow bezel of the display substrate.

As shown in FIG. 4 to FIG. 8, in some embodiments, the signal line includes a first electrically conductive layer 41 and a second electrically conductive layer 42 which are arranged in different layers, and the first electrically conductive layer 41 is coupled to the second electrically conductive layer 42;

at least a part of a side surface included by at least one of the first electrically conductive layer 41 or the second electrically conductive layer 42 that is away from the display area 10 is located between the blocking portion 302 and the groove structure, and the side surface is covered by the blocking portion 302.

Illustratively, the side surface of the first electrically conductive layer 41 away from the display area 10 is covered by the crack barrier structure 30; and/or the side surface of the second electrically conductive layer 42 away from the display area 10 is covered by the crack barrier structure 30.

It is noted that, the arranging the first electrically conductive layer 41 and the second electrically conductive layer 42 in different layers means that the first electrically conductive layer 41 and the second electrically conductive layer 42 are at least partially stacked one on another.

Illustratively, there is an insulating layer between the first electrically conductive layer 41 and the second electrically conductive layer 42, and there is an overlap region between the orthographic projection of the first electrically conductive layer 41 onto the base 60 and the orthographic projection of the second electrically conductive layer 42 onto the base 60. In the overlap region, the first electrically conductive layer 41 is coupled to the second electrically conductive layer 42 through a via hole.

Illustratively, the first electrically conductive layer 41 and the second electrically conductive layer 42 are directly bonded together without an insulating layer therebetween.

Illustratively, at least a part of the side surface included by the first electrically conductive layer 41 that is away from the display area 10 is located between the blocking portion 302 and the groove structure, and the side surface is covered by the blocking portion 302.

Illustratively, at least a part of the side surface included by the second electrically conductive layer 42 that is away from the display area 10 is located between the blocking portion 302 and the groove structure, and the side surface is covered by the blocking portion 302.

Illustratively, the first electrically conductive layer 41 or the second electrically conductive layer 42 can extend to the vicinity of the crack barrier structure 30, and the first electrically conductive layer 41 or the second electrically conductive layer 42 can be covered by the crack barrier structure 30.

Illustratively, both the first electrically conductive layer 41 and the second electrically conductive layer 42 can extend to the vicinity of the crack barrier structure 30, and both the side surface of the first electrically conductive layer 41 away from the display area 10 and the side surface of the second electrically conductive layer 42 away from the display area 10 can be covered by the crack barrier structure 30.

Illustratively, in case that both the side surface of the first electrically conductive layer 41 away from the display area 10 and the side surface of the second electrically conductive layer 42 away from the display area 10 can be covered by the crack barrier structure 30, the dam structure may be omitted from the display substrate, thereby further reducing the bezel width of the display substrate.

Illustratively, the display substrate further includes an encapsulation layer. The encapsulation layer includes a first inorganic encapsulation layer, an organic encapsulation layer, and a second inorganic encapsulation layer sequentially arranged in a stack in a direction away from the base 60. The dam structure in the display substrate is used for delimiting the organic encapsulation layer, to avoid overflow of an organic encapsulation material during a process of forming the organic encapsulation layer using the organic encapsulation material. If the display substrate is designed not to include the dam structure, an inorganic material with a poor affinity, such as silicon nitride, may be used as the first inorganic encapsulation material; in this way, the risk of organic encapsulation material overflow can be reduced when the organic encapsulation layer is fabricated.

In the display substrate according to the above-mentioned embodiment, with the signal line including a first electrically conductive layer 41 and a second electrically conductive layer 42 arranged in different layers and coupled to each other, a voltage drop over the signal line when transmitting signals is effectively reduced, ensuring the strength of the signals transmitted by the signal line, and further ensuring the display performance of the display substrate.

In addition, with at least a part of the side surface included by at least one of the first electrically conductive layer 41 or the second electrically conductive layer 42 that is away from the display area 10 being located between the blocking portion 302 and the groove structure, and the side surface being covered by the blocking portion 302, the risk of corrosion of the signal line during the manufacturing process of the display substrate is reduced, and the yield of signal line is guaranteed.

Furthermore, with at least a part of the side surface included by at least one of the first electrically conductive layer 41 or the second electrically conductive layer 42 that is away from the display area 10 being located between the blocking portion 302 and the groove structure, and the side surface being covered by the blocking portion 302, the size of the dam structure for blocking the organic encapsulation layer in the display substrate can be reduced, or the dam structure can be omitted directly, so as to better realize the narrow bezel of the display substrate.

As shown in FIG. 3 to FIG. 7 and FIG. 9, in some embodiments, the display substrate further includes a dam structure located at the peripheral area 20, the dam structure surrounds the display area 10, and at least a part of the orthographic projection of the dam structure onto the base is located between the orthographic projection of the crack barrier structure 30 onto the base and the display area 10;

a minimum distance between a boundary of the orthographic projection of the dam structure onto the base 60 close to the display area 10 and a boundary of the orthographic projection of the dam structure onto the base 60 away from the display area 10 is less than or equal to 110 μm.

Illustratively, the dam structure surrounds the display area 10, and the crack barrier structure 30 at least partially surrounds the dam structure.

Illustratively, the dam structure surrounds the display area 10, and the crack barrier structure 30 surrounds the dam structure.

Illustratively, the minimum distance between a boundary of the orthographic projection of the dam structure onto the base 60 close to the display area 10 and a boundary of the orthographic projection of the dam structure onto the base 60 away from the display area 10 is 90 μm.

Illustratively, the dam structure includes: a first dam 51 and a second dam 52, wherein the width of the orthographic projection of the first dam 51 onto the base 60 is 30 microns, the width of the orthographic projection of the second dam 52 onto the base 60 is 30 microns, and the distance between the orthographic projection of the first dam 51 onto the base 60 and the orthographic projection of the second dam 52 onto the base 60 is 30 microns.

With the minimum distance between the boundary of the orthographic projection of the dam structure onto the base 60 close to the display area 10 and the boundary of the orthographic projection of the dam structure onto the base 60 away from the display area 10 being less than or equal to 110 μm, not only an effective barrier of the dam structure against the organic encapsulation material is ensured, but also the dam structure can occupy less layout space in the peripheral area 20. Therefore, the display substrate provided by the above-mentioned embodiments may adequately achieve a narrow bezel of the display substrate.

In some embodiments, the dam structure includes at least one dam that surrounds the display area 10.

Figure 10:
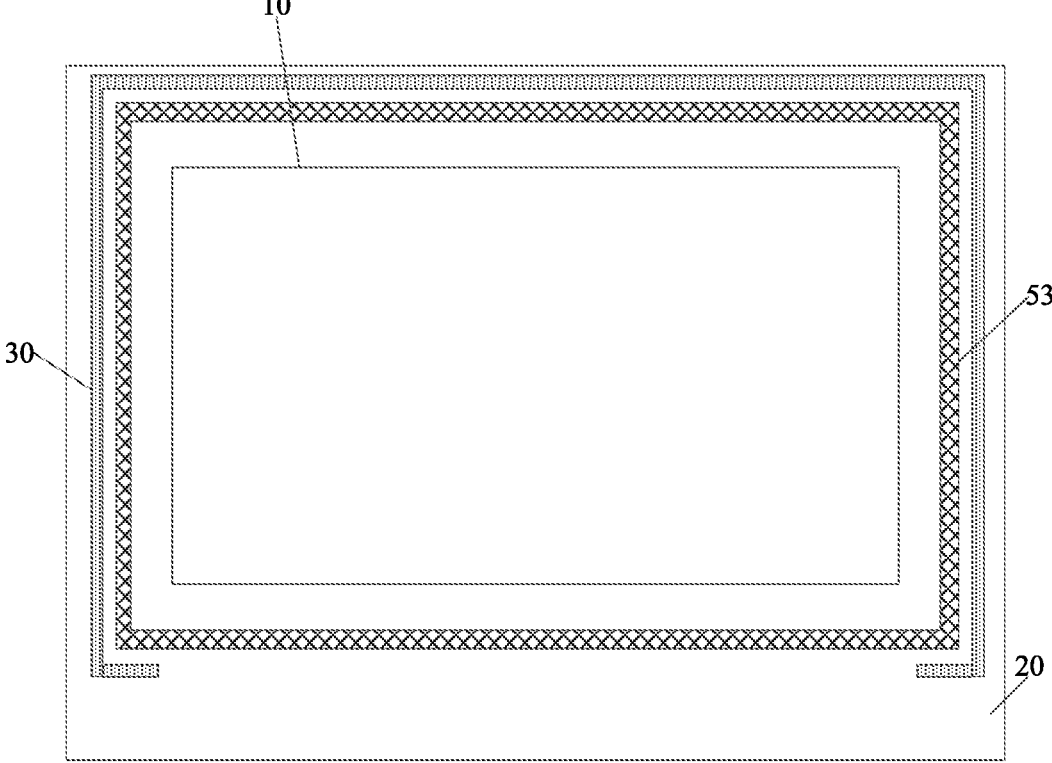
FIG. 10 is a first schematic layout diagram of a dam and a crack barrier structure according to an embodiment of the present disclosure.

As shown in FIG. 10, the dam structure includes one third dam 53 surrounding the display area 10.

Figure 4:
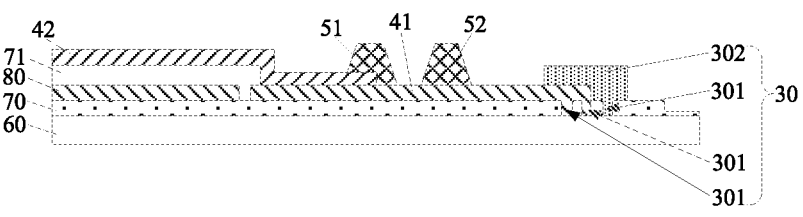
FIG. 4 is a first schematic diagram showing at least a part of a side surface of a signal line according to an embodiment of the present disclosure is covered.
Figure 6:
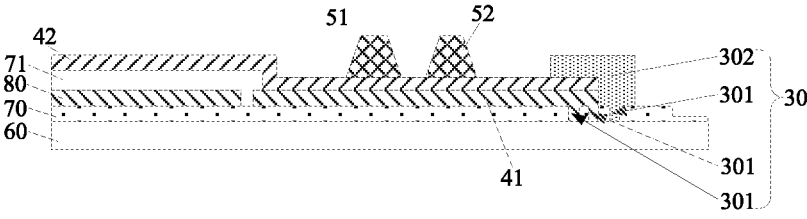
FIG. 6 is a third schematic diagram showing at least a part of a side surface of a signal line according to an embodiment of the present disclosure is covered.
Figure 9:
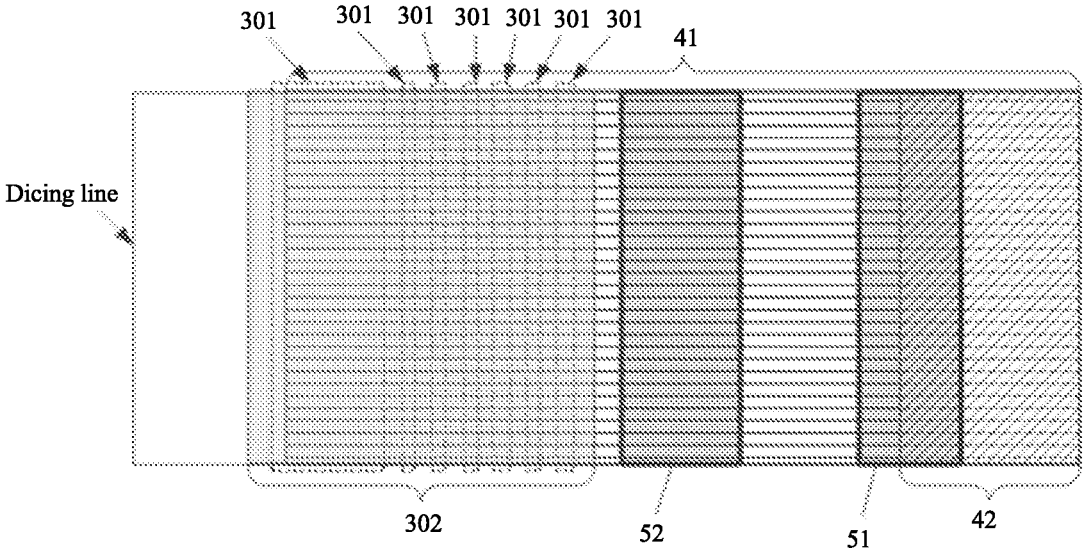
FIG. 9 is a schematic layout diagram of a left bezel of a display substrate according to an embodiment of the present disclosure.

As shown in FIG. 4, FIG. 6 and FIG. 9, in some embodiments, the dam structure includes: a first dam 51 surrounding the display area 10, and a second dam 52 surrounding the first dam 51.

Figure 5:
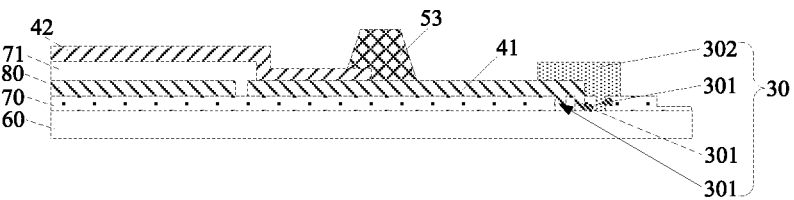
FIG. 5 is a second schematic diagram showing at least a part of a side surface of a signal line according to an embodiment of the present disclosure is covered.
Figure 7:
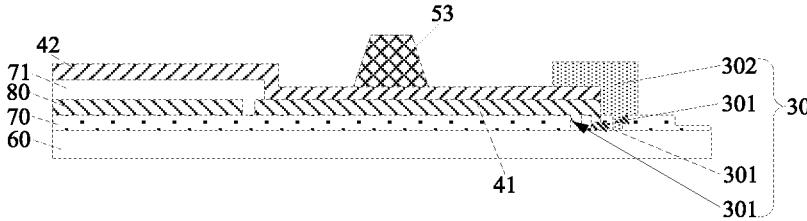
FIG. 7 is a fourth schematic diagram showing at least a part of a side surface of a signal line according to an embodiment of the present disclosure is covered.
Figure 8:
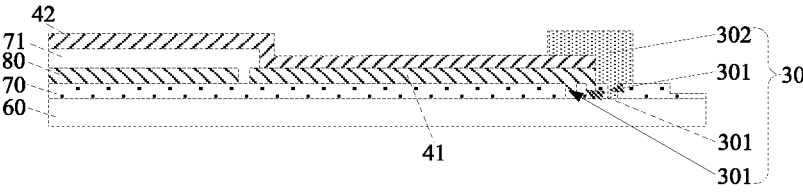
FIG. 8 is a fifth schematic diagram showing at least a part of a side surface of a signal line according to an embodiment of the present disclosure is covered.

As shown in FIG. 5 and FIG. 7, in some embodiments, the dam structure includes: a third dam 53, the third dam 53 surrounding the display area 10.

Illustratively, the first dam 51, the second dam 52 and the third dam 53 include a plurality of dam patterns arranged in a stack, and the dam patterns and other structures in the display substrate can be formed simultaneously in the same patterning process, thereby effectively simplifying the manufacturing process of the display substrate and reducing the manufacturing cost of the display substrate.

In some embodiments, one of the first dam 51 and the second dam 52 includes a first dam part, a second dam part, a third dam part, and a fourth dam part coupled in sequence; the first dam part is located at a lower bezel of the display substrate, the first dam part includes a first dam portion and a second dam portion with the same extension direction, the first dam portion is located between the second dam portion and the display area, a first end of the first dam portion is coupled to a first end of the second dam portion, and a second end of the first dam portion is coupled to a second end of the second dam portion.

Figure 11:
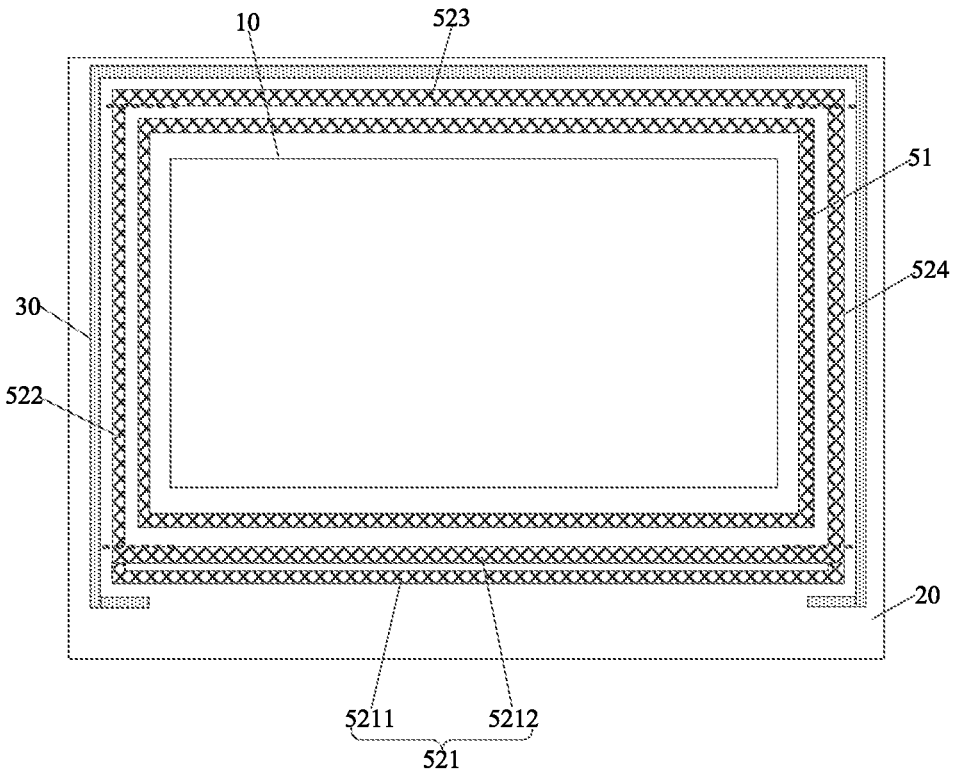
FIG. 11 is a second schematic layout diagram of dams and a crack barrier structure according to an embodiment of the present disclosure.

As shown in FIG. 11, the second dam 52 includes a first dam portion 521, a second dam portion 522, a third dam portion 523 and a fourth dam portion 524 which are coupled sequentially. The first dam portion 521 includes a first dam portion 5212 and a second dam portion 5211 extending in the same direction, the first dam portion 5212 is located between the second dam portion 5211 and the display area 10, a first end of the first dam portion 5212 is coupled to a first end of the second dam portion 5211, and a second end of the first dam portion 5212 is coupled to a second end of the second dam portion 5211.

The above-mentioned arrangement is beneficial to improving the blocking ability of the dam structure at the lower bezel of the display substrate.

In some embodiments, there is a minimum first distance d1 between the boundary of the orthographic projection of the first dam 51 onto the base 60 close to the display area 10 and the boundary of the orthographic projection of the second dam 52 onto the base 60 away from the display area 10, and d1 satisfies: 70 μm≤d1≤110 μm.

With the dam structure including the first dam 51 and the second dam 52, the barrier effect of the dam structure against the organic encapsulation material is enhanced. Meanwhile, with d1 satisfying: 70 μm≤d1≤110 μm, narrow bezel of the display substrate is well achieved.

Illustratively, d1 satisfies: 80 μm≤d1≤100 μm.

In some embodiments, a minimum distance between a boundary of an orthographic projection of the third dam 53 onto the base 60 that is near the display area 10 and a boundary of the orthographic projection of the third dam 53 onto the base 60 that is far from the display area 10 is between 30 μm and 40 μm, inclusive.

With the dam structure including only one third dam 53 having the above-mentioned dimensions, not only the blocking effect of the dam structure against the organic packaging material is ensured, but also the narrow bezel of the display substrate is well achieved.

As shown in FIGS. 4 and 5, in some embodiments, the signal line includes a first electrically conductive layer 41 and a second electrically conductive layer 42 arranged in different layers, the first electrically conductive layer 41 being coupled to the second electrically conductive layer 42; the side surface of the first electrically conductive layer 41 away from the display area 10 is covered by the blocking portion 302, and the side surface of the second electrically conductive layer 42 away from the display area 10 is covered by one dam.

Illustratively, the side surface of the second electrically conductive layer 42 away from the display area 10 is covered by one of the first dam 51, the second dam 52 and the third dam 53.

Illustratively, the side surface of the first electrically conductive layer 41 away from the display area 10 is covered by the blocking portion 302, and the side surface of the second electrically conductive layer 42 away from the display area 10 is covered by the first dam 51.

Illustratively, the side surface of the first electrically conductive layer 41 away from the display area 10 is covered by the blocking portion 302, and the side surface of the second electrically conductive layer 42 away from the display area 10 is covered by the second dam 52.

Illustratively, the side surface of the first electrically conductive layer 41 away from the display area 10 is covered by the blocking portion 302, and the side surface of the second electrically conductive layer 42 away from the display area 10 is covered by the third dam 53.

The above-mentioned arrangement enables the first electrically conductive layer 41 to extend to the vicinity of the crack barrier structure 30, effectively reducing the voltage drop over the signal line when transmitting signals, ensuring the strength of signals transmitted by the signal line, and thus ensuring the display performance of the display substrate.

In addition, with the side surface of the first electrically conductive layer 41 away from the display area 10 being covered by the blocking portion 302, and the side surface of the second electrically conductive layer 42 away from the display area 10 being covered by one of the first dam 51, the second dam 52 and the third dam 53, the risk of corrosion of the signal line during the manufacturing process of the display substrate is reduced, and the yield of the signal line is well guaranteed.

In addition, since the side surface of the first electrically conductive layer 41 away from the display area 10 is covered by the blocking portion 302, the size of the dam structure for blocking the organic encapsulation layer in the display substrate can be reduced, thereby better realizing the narrow bezel of the display substrate.

As shown in FIG. 4 and FIG. 5, in some embodiments, the signal line includes a first electrically conductive layer 41 and a second electrically conductive layer 42 arranged in different layers, the first electrically conductive layer 41 being coupled to the second electrically conductive layer 42;

the side surface of the first electrically conductive layer 41 away from the display area 10 is covered by the crack barrier structure 30, and the side surface of the second electrically conductive layer 42 away from the display area 10 is covered by one of the first dam 51, the second dam 52 and the third dam 53.

Illustratively, the side surface of the first electrically conductive layer 41 away from the display area 10 is covered by the crack barrier structure 30, and the side surface of the second electrically conductive layer 42 away from the display area 10 is covered by the first dam 51.

Illustratively, the side surface of the first electrically conductive layer 41 away from the display area 10 is covered by the crack barrier structure 30, and the side surface of the second electrically conductive layer 42 away from the display area 10 is covered by the second dam 52.

Illustratively, the side surface of the first electrically conductive layer 41 away from the display area 10 is covered by the crack barrier structure 30, and the side surface of the second electrically conductive layer 42 away from the display area 10 is covered by the third dam 53.

The above-mentioned arrangement enables the first electrically conductive layer 41 to extend to the vicinity of the crack barrier structure 30, effectively reducing the voltage drop over the signal line when transmitting signals, ensuring the strength of signals transmitted by the signal line, and thus ensuring the display performance of the display substrate.

In addition, with the side surface of the first electrically conductive layer 41 away from the display area 10 being covered by the crack barrier structure 30, and the side surface of the second electrically conductive layer 42 away from the display area 10 being covered by one of the first dam 51, the second dam 52 and the third dam 53, the risk of corrosion of the signal line during the manufacturing process of the display substrate is reduced, and the yield of the signal line is well guaranteed.

In addition, since the side surface of the first electrically conductive layer 41 away from the display area 10 is covered by the crack barrier structure 30, the size of the dam structure for blocking the organic encapsulation layer in the display substrate can be reduced, thereby better realizing the narrow bezel of the display substrate.

As shown in FIG. 4 to FIG. 8, in some embodiments, at least a part of the first electrically conductive layer 41 is located between the second electrically conductive layer 42 and the base 60.

Illustratively, the first electrically conductive layer 41 and the second electrically conductive layer 42 can both be provided in the same layer and be made of the same material as other electrically conductive structures in the display substrate, so that the first electrically conductive layer 41 and the second electrically conductive layer 42 can be formed simultaneously with other electrically conductive structures in the same patterning process. Therefore, the manufacturing process of the display substrate is effectively simplified, and the manufacturing cost of the display substrate is reduced.

In some embodiments, the first electrically conductive layer 41 is made of a first source-drain metal layer, and the second electrically conductive layer 42 is made of a second source-drain metal layer.

The above-mentioned arrangement enables forming simultaneously, in the same patterning process, the first electrically conductive layer 41 and other structures (for example, the reference numeral 80 in FIG. 4 to FIG. 8) in the display substrate that are made of the first source-drain metal layer. Meanwhile, the above-mentioned arrangement enables forming simultaneously, in the same patterning process, the second electrically conductive layer 42 and other structures in the display substrate that are made of the second source-drain metal layer. Therefore, the manufacturing process of the display substrate is effectively simplified, and the manufacturing cost of the display substrate is reduced.

Figure 12:
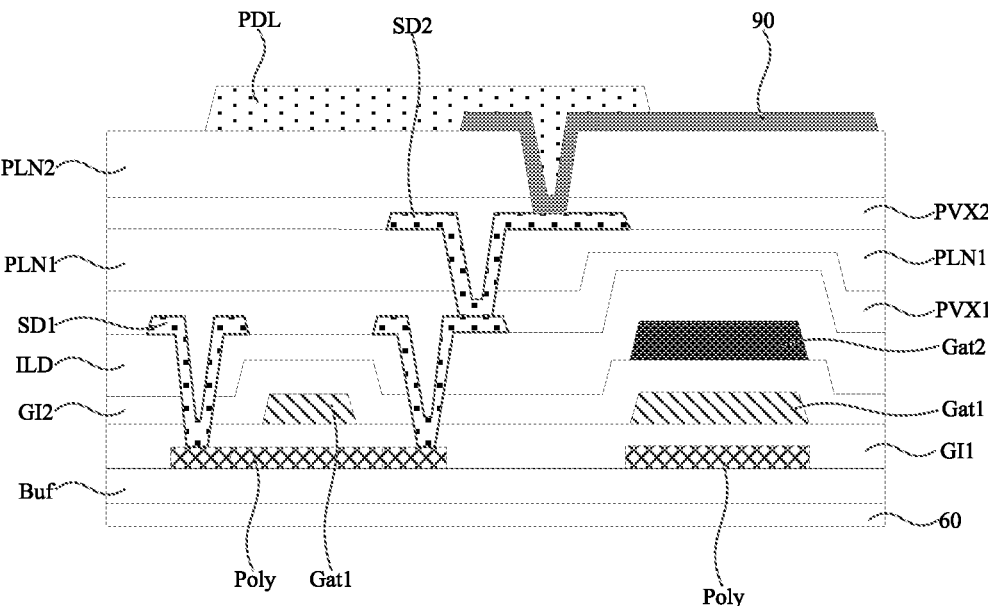
FIG. 12 is a partial cross-sectional view of a display substrate according to an embodiment of the present disclosure.

As shown in FIG. 12, illustratively, the display substrate includes a buffer layer Buf, an active layer Poly, a first gate insulating layer GI1, a first gate metal layer Gat1, a second gate insulating layer GI2, a second gate metal layer Gat2, an interlayer insulating layer ILD, a first source-drain metal layer SD1, a first passivation layer PVX1, a first planarization layer PLN1, a second source-drain metal layer SD2, a second passivation layer PVX2, a second planarization layer PLN2, an anode layer 90, a pixel definition layer PDL, a light-emitting functional layer, a cathode layer and an encapsulation structure which are sequentially arranged one on another in a direction away from the base 60. Illustratively, the display substrate may not include the first passivation layer PVX1 and/or the second passivation layer PVX2.

As shown in FIG. 4 to FIG. 9, in some embodiments, the display substrate further includes: an insulating layer 70 located at the peripheral area 20;

the crack barrier structure 30 includes:

a groove structure located in the insulating layer 70, wherein the groove structure at least partially surrounds the display area 10;

a blocking portion 302, wherein a part of the blocking portion 302 is located in the groove structure;

the at least a part of the side surface is located between the blocking portion 302 and the groove structure.

In some embodiments, at least a part of the signal line is located in the groove structure.

Illustratively, the insulating layer 70 includes at least one of inorganic insulating layers, such as a gate insulating layer and an interlayer insulating layer.

Illustratively, the depth of the groove structure is greater than or equal to the thickness of the insulating layer 70 in a direction perpendicular to the base 60. The groove structure penetrates through the insulating layer 70.

Illustratively, a portion of the blocking portion 302 is located in the groove structure, and another portion of the blocking portion 302 is located outside the groove structure.

Illustratively, the at least a part of the side surface is located between the blocking portion 302 and the groove structure, and the at least a part of the side surface is covered by the blocking portion 302.

The signal line includes the first electrically conductive layer 41 and the second electrically conductive layer 42. Illustratively, at least a part of the side surface of the first electrically conductive layer 41 is located between the blocking portion 302 and the groove structure, and at least a part of the first electrically conductive layer 41 is located in the groove structure. Illustratively, at least a part of the side surface of the second electrically conductive layer 42 is located between the blocking portion 302 and the groove structure, and at least a part of the second electrically conductive layer 42 is located in the groove structure.

With at least a part of the side surface being arranged between the blocking portion 302 and the groove structure, and at least a part of the signal line being located in the groove structure, the side surface of the signal line is better covered and the risk of corrosion of the side surface of the signal line is reduced.

As shown in FIG. 4 to FIG. 8, in some embodiments, the groove structure includes at least two grooves 301 arranged in sequence in a direction away from the display area 10, and at least a part of the orthographic projection of the grooves 301 onto the base extends in the extension direction of the boundary of the display area 10;

the at least two grooves 301 include at least one target groove and at least one non-target groove, the at least one target groove being closer to the display area 10;

at least a part of the signal line is located in the at least one target groove;

a part of the blocking portion 302 is located in the at least one target groove and the at least one non-target groove.

Illustratively, the at least one target groove is located between the at least one non-target groove and the display area 10.

The signal line includes the first electrically conductive layer 41 and the second electrically conductive layer 42. Illustratively, at least a part of a side surface of the first electrically conductive layer 41 is located between the blocking portion 302 and the groove structure, and at least a part of the first electrically conductive layer 41 is located in the at least one target groove. Illustratively, at least a part of the side surface of the second electrically conductive layer 42 is located between the blocking portion 302 and the groove structure, and at least a part of the second electrically conductive layer 42 is located in the at least one target groove.

With at least a part of the signal line being located in the at least one target groove, and the at least a part of the side surface being located between the blocking portion 302 and the groove structure, the side surface of the signal line can be better covered and the risk of corrosion of the side surface of the signal line is reduced.

With the groove structure including the at least two grooves, and a part of the blocking portion 302 being located in the at least one target groove and the at least one non-target groove, the crack barrier structure 30 can provide multiple tiers of barriers against the propagation of cracks, thereby better guaranteeing the yield of the display substrate.

As shown in FIG. 9, in some embodiments, the groove structure includes at least two grooves sequentially arranged in a direction away from the display area, and at least a part of an orthographic projection of the grooves onto the base extends in an extension direction of a boundary of the display area;

at least a part of the signal line is located in each groove, and a part of the blocking portion 302 is located in each groove;

the orthographic projection of the at least a part of the side surface onto the base 60 is between the orthographic projection of a boundary of the blocking portion 302 away from the display area 10 onto the base 60 and the display area 10.

The signal line includes the first electrically conductive layer 41 and the second electrically conductive layer 42. Illustratively, at least a part of the side surface of the first electrically conductive layer 41 is located between the blocking portion 302 and the groove structure, and at least a part of the first electrically conductive layer 41 is located in each groove. Illustratively, at least a part of the side surface of the second electrically conductive layer 42 is located between the blocking portion 302 and the groove structure, and at least a part of the second electrically conductive layer 42 is located in each groove.

With at least a part of the signal line being located in each target groove, and the orthographic projection of the at least a part of the side surface onto the base 60 being located between the orthographic projection of the boundary of the blocking portion 302 away from the display area 10 onto the base 60 and the display area 10, the side surface of the signal line can be better covered, thereby reducing the risk of corrosion of the side surface of the signal line.

With the groove structure including the at least two grooves, at least a part of the signal line being located in each groove, a part of the blocking portion 302 being located in each groove, and the orthographic projection of the at least a part of the side surface onto the base 60 being located between the orthographic projection of the boundary of the blocking portion 302 away from the display area 10 onto the base 60 and the display area 10, the crack barrier structure 30 can provide multiple tiers of barriers against the propagation of cracks, thereby better guaranteeing the yield of the display substrate.

In some embodiments, the signal line includes a first electrically conductive layer and a second electrically conductive layer arranged in different layers, the first electrically conductive layer being coupled to the second electrically conductive layer; the at least a part of the signal line includes the first electrically conductive layer.

Illustratively, the first electrically conductive layer is located in the at least one target groove.

Illustratively, the first electrically conductive layer is located in each groove.

In some embodiments, the signal line includes a first electrically conductive layer and a second electrically conductive layer arranged in different layers, the first electrically conductive layer being coupled to the second electrically conductive layer; the at least a part of the signal line includes the first electrically conductive layer and the second electrically conductive layer.

Illustratively, the first electrically conductive layer and the second electrically conductive layer are located in the at least one target groove.

Illustratively, the first electrically conductive layer and the second electrically conductive layer are located in each groove.

In some embodiments, the blocking portion 302 is made of at least one of a first planarization layer or a second planarization layer.

The above-mentioned arrangement enables forming, in the same patterning process, the blocking portion 302 and other structures (e.g., reference numeral 71 in FIG. 4 to FIG. 8) in the display substrate that are made of the first planarization layer and/or the second planarization layer, thereby simplifying the manufacturing process of the display substrate and reducing the manufacturing cost of the display substrate.

Figure 2:
FIG. 2 is a schematic structure diagram of a negative power supply line according to an embodiment of the present disclosure.

As shown in FIG. 1 and FIG. 2, in some embodiments, the signal line includes at least one of a positive power supply line VDD and a negative power supply line VSS.

In some embodiments, the negative power supply line VSS includes:

an annular portion VSS1, wherein the annular portion VSS1 semi-encloses the display area 10, and the annular portion VSS1 includes the first electrically conductive layer 41 and the second electrically conductive layer 42;

two line inlet portions VSS2, wherein the two line inlet portions VSS2 are coupled to two end portions of the annular portion VSS1 in one-to-one correspondence.

Illustratively, the display substrate further includes a cathode layer, the cathode layer may extends from the display area 10 to a peripheral area 20, and the cathode layer is coupled to the annular portion VSS1 to receive signals transmitted by the annular portion VSS1.

Illustratively, the negative power supply line VSS includes at least two line inlet portions VSS2 correspondingly coupled to end portions of the annular portion VSS1.

Illustratively, the annular portion VSS1 at least partially surrounds the display area 10.

With the annular portion VSS1 including the first electrically conductive layer 41 and the second electrically conductive layer 42, at least a part of the side surface of the negative power supply line VSS can be protected, thereby reducing the risk of corrosion of the side surface. Furthermore, the voltage drop over the negative power supply line VSS can be reduced, to ensure the signal strength of the negative power supply signals transmitted through the negative power supply line VSS, thereby ensuring the operation performance of the display substrate.

As shown in FIG. 1 and FIG. 2, in some embodiments, the display substrate further includes a driving chip, wherein the driving chip is located at a peripheral area 20 of the display substrate, and the driving chip is coupled to the two line inlet portions VSS2;

the annular portion VSS1 includes a first end portion VSS11, a second end portion VSS12, and a connecting portion VSS13 connected between the first end portion VSS11 and the second end portion VSS12, wherein the connecting portion VSS13 extends along the boundary of the display area 10; the first end portion VSS11 and the second end portion VSS12 are coupled to the two line inlet portions VSS2 in one-to-one correspondence; the connecting portion VSS13 includes the first electrically conductive layer 41 and the second electrically conductive layer 42.

Illustratively, a flexible printed circuit FPC is bonded to a peripheral area of the display substrate, and the two line inlet portions VSS2 are coupled to the flexible printed circuit FPC. A positive power supply line VDD is coupled to the flexible printed circuit FPC.

Illustratively, the driving chip may be bonded directly at the peripheral area 20 of the display substrate.

Illustratively, the driving chip may also be bonded on a flexible printed circuit FPC. The two line inlet portions VSS2 and the positive power supply line VDD are coupled to the driving chip through the flexible printed circuit FPC.

Illustratively, the driving chip is located at the lower bezel of the display substrate, and the first end portion VSS11 and the second end portion VSS12 are both located at the lower bezel of the display substrate. The connecting portion VSS13 includes: a portion located at the left bezel of the display substrate, a portion located at the right bezel of the display substrate, and a portion located at the upper bezel of the display substrate.

Illustratively, the driving chip transmits signals to the annular portion VSS1 through the two line inlet portions VSS2.

With the connecting portion VSS13 including the first electrically conductive layer 41 and the second electrically conductive layer 42, at least a part of the side surface of the negative power supply line VSS can be protected, reducing the risk of corrosion of the side surface. Furthermore, the voltage drop over the negative power supply line VSS can be reduced, to ensure the signal strength of the negative power supply signals transmitted through the negative power supply line VSS, thereby ensuring the operation performance of the display substrate.

An embodiment of the present disclosure further provides a display device including the display substrate according to the above embodiments.

Illustratively, the display device includes an organic light emitting diode display device.

It is noted that, the display device may be: any product or component with a display function, such as a television, a display, a digital photo frame, a mobile phone, or a tablet computer, wherein the display device further includes a flexible printed circuit, a printed circuit board, a backboard, etc.

In the display substrate according to the foregoing embodiments, the signal line is extended to the vicinity of the crack barrier structure, and at least a part of the side surface of the signal line away from the display area is covered by the crack barrier structure. Since at least a part of the side surface of the signal line is covered by the crack barrier structure, the risk of corrosion of the signal line during the manufacturing process of the display substrate is reduced, and the yield of signal line is well guaranteed. Furthermore, extending the signal line to the vicinity of the crack barrier structure can effectively increase the wiring width of the signal line, reduce the voltage drop over the signal line when transmitting signals, ensure that signals inputted to the display area via the signal line have a high strength, thereby ensuring the display uniformity of the display panel, and improving the operation performance of the display substrate. In addition, since at least a part of the side surface of the signal line is covered by the crack barrier structure, the size of the dam structure for blocking the organic encapsulation layer in the display substrate can be reduced, thereby better realizing the narrow bezel of the display substrate.

The display device provided by the embodiment of the present disclosure also has the above-mentioned advantageous effects when including the above-mentioned display substrate, and will not be described in detail herein.

Note that the expression "same layer" used in the embodiments of the present disclosure may refer to that film layers are in the same structural layer. Or, for example, the film layer in the same layer may be a layer structure formed by forming a film layer for forming a specific pattern using the same film forming process and then patterning the film layer through one patterning process using the same mask. Depending on the particular pattern, a single patterning process may include multiple exposure, development, or etching processes, and the particular pattern in the resulting layer structure may or may not be continuous. The particular patterns may also be at different heights or have different thicknesses.

In various method embodiments of the present disclosure, the serial numbers of various steps are not intended to define the order of steps, and for a person of ordinary skill in the art, without involving any inventive effort, changes in the order of the steps are also within the scope of the present disclosure.

It should be noted that the various embodiments described herein are described in a progressive manner, each embodiment focuses on differences from the other embodiments, and for description of the same or similar parts of one embodiment, reference may be made to other embodiments. In particular, the method embodiments are described more simply because they are substantially similar to the product embodiments; for related description, refers to the description of the product embodiments.

Unless defined otherwise, technical or scientific terms used in this disclosure shall have the ordinary meaning as understood by one of ordinary skill in the art to which this disclosure belongs. The terms "first", "second", and the like as used herein do not denote any order, quantity, or importance, but rather are used to distinguish one element from another. The term "including" or "comprising", and the like, means that an element or item preceding the term encompasses the elements or items listed after the term and equivalents thereof, but does not exclude other elements or items. The terms "connecting", "coupling" or "connected" and the like are not limited to physical or mechanical connections, but may include electrical connections, whether direct or indirect. The terms "upper", "lower", "left", "right" and the like are used only to indicate relative positional relationships that may change accordingly when the absolute position of the object being described changes.

It will be understood that when an element such as a layer, film, region or substrate is referred to as being "on" or "under" another element, it can be "directly on" or "directly under" the other element or intervening elements may be present.

In the description of the embodiments above, particular features, structures, materials, or characteristics may be combined in any suitable manner in any one or more embodiments or examples.

The aforementioned are merely specific implementations of the present disclosure, but the scope of the disclosure is by no means limited thereto. Any modifications or replacements that would easily occurred to those skilled in the art, without departing from the technical scope disclosed in the disclosure, should be encompassed in the scope of the present disclosure. Therefore, the scope of the present disclosure is to be determined by the scope of the claims.

What is claimed is:

1. A display substrate, comprising a base, the base comprising a display area and a peripheral area located at the periphery of the display area; wherein the display substrate further comprises:

an insulating layer located at the peripheral area;

a crack barrier structure located at the peripheral area, wherein at least a part of an orthographic projection of the crack barrier structure onto the base extends along an extension direction of a boundary of the display area; the crack barrier structure comprises: a groove structure and a blocking portion, the groove structure being located in the insulating layer, and a part of the blocking portion being located in the groove structure; and a signal line located at the peripheral area, wherein the signal line comprises a top surface facing away from the base, and a side surface located between the top surface and the base, and at least a part of the side surface away from the display area is located between the blocking portion and the groove structure, wherein at least a part of the signal line is located in the groove structure and is covered by the blocking portion of the crack barrier structure.

2. The display substrate according to claim 1, wherein the signal line comprises a first electrically conductive layer and a second electrically conductive layer which are arranged in different layers, and the first electrically conductive layer is coupled to the second electrically conductive layer;

at least a part of a side surface comprised by at least one of the first electrically conductive layer or the second electrically conductive layer that is away from the display area is located between the blocking portion and the groove structure, the side surface being covered by the blocking portion.

3. The display substrate according to claim 1, wherein the display substrate further comprises a dam structure located at the peripheral area, the dam structure surrounds the display area, and at least a part of an orthographic projection of the dam structure onto the base is located between the orthographic projection of the crack barrier structure onto the base and the display area;

a minimum distance between a boundary of the orthographic projection of the dam structure onto the base close to the display area and a boundary of the orthographic projection of the dam structure onto the base away from the display area is less than or equal to 110 μm.

4. The display substrate according to claim 3, wherein the dam structure comprises at least one dam surrounding the display area.

5. The display substrate according to claim 4, wherein the dam structure comprises: a first dam and a second dam, the first dam surrounding the display area, and the second dam surrounding the first dam.

6. The display substrate according to claim 5, wherein one of the first dam and the second dam comprises a first dam part, a second dam part, a third dam part, and a fourth dam part coupled in sequence;

the first dam part is located at a lower bezel of the display substrate, the first dam part comprises a first dam portion and a second dam portion with the same extension direction, the first dam portion is located between the second dam portion and the display area, a first end of the first dam portion is coupled to a first end of the second dam portion, and a second end of the first dam portion is coupled to a second end of the second dam portion.

7. The display substrate according to claim 5, wherein a minimum first distance d1 between a boundary of an orthographic projection of the first dam onto the base close to the display area and a boundary of an orthographic projection of the second dam onto the base away from the display area satisfies: 70 μm≤d1≤110 μm.

8. The display substrate according to claim 5, wherein the signal line comprises a first electrically conductive layer and a second electrically conductive layer which are arranged in different layers, and the first electrically conductive layer is coupled to the second electrically conductive layer; a side surface of the first electrically conductive layer away from the display area is covered by the blocking portion, and a side surface of the second electrically conductive layer away from the display area is covered by one dam.

9. The display substrate according to claim 2, wherein at least a part of the first electrically conductive layer is located between the second electrically conductive layer and the base.

10. The display substrate according to claim 2, wherein the first electrically conductive layer is made of a first source-drain metal layer, and the second electrically conductive layer is made of a second source-drain metal layer.

11. The display substrate according to claim 1, wherein the groove structure comprises at least two grooves arranged in sequence in a direction away from the display area, and at least a part of an orthographic projection of the grooves onto the base extends in the extension direction of the boundary of the display area;

the at least two grooves comprise at least one target groove and at least one non-target groove, the at least one target groove being closer to the display area;

at least a part of the signal line is located in the at least one target groove;

a part of the blocking portion is located in the at least one target groove and the at least one non-target groove;

or, wherein the groove structure comprises at least two grooves arranged in sequence in a direction away from the display area, and at least a part of an orthographic projection of the grooves onto the base extends in the extension direction of the boundary of the display area;

at least a part of the signal line is located in each groove, and a part of the blocking portion is located in each groove;

an orthographic projection of the at least a part of the side surface onto the base is between an orthographic projection of a boundary of the blocking portion away from the display area onto the base and the display area.

12. The display substrate according to claim 11, wherein the signal line comprises a first electrically conductive layer and a second electrically conductive layer which are arranged in different layers, and the first electrically conductive layer is coupled to the second electrically conductive layer;

the at least a part of the signal line comprises the first electrically conductive layer.

13. The display substrate according to claim 11, wherein the signal line comprises a first electrically conductive layer and a second electrically conductive layer which are arranged in different layers, and the first electrically conductive layer is coupled to the second electrically conductive layer;

the at least a part of the signal line comprises the first electrically conductive layer and the second electrically conductive layer.

14. The display substrate according to claim 1, wherein the blocking portion is made of at least one of a first planarization layer or a second planarization layer.

15. The display substrate according to claim 2, wherein the signal line comprises at least one of a positive power supply line or a negative power supply line.

16. The display substrate according to claim 15, wherein the negative power supply line comprises:

an annular portion semi-enclosing the display area, the annular portion comprising the first electrically conductive layer and the second electrically conductive layer;

two line inlet portions coupled in one-to-one correspondence to two end portions of the annular portion.

17. The display substrate according to claim 16, wherein the display substrate further comprises a driving chip, the driving chip is located at the peripheral area of the display substrate, and the driving chip is coupled to the two line inlet portions;

the annular portion comprises a first end portion, a second end portion, and a connecting portion connected between the first end portion and the second end portion, the connecting portion extending along the boundary of the display area; the first end portion and the second end portion are coupled to the two line inlet portions in one-to-one correspondence; the connecting portion comprises the first electrically conductive layer and the second electrically conductive layer.

18. A display device comprising a display substrate, wherein the display substrate comprises a base, the base comprising a display area and a peripheral area located at the periphery of the display area; wherein the display substrate further comprises:

an insulating layer located at the peripheral area;

a crack barrier structure located at the peripheral area, wherein at least a part of an orthographic projection of the crack barrier structure onto the base extends along an extension direction of a boundary of the display area; the crack barrier structure comprises: a groove structure and a blocking portion, the groove structure being located in the insulating layer, and a part of the blocking portion being located in the groove structure; and a signal line located at the peripheral area, wherein the signal line comprises a top surface facing away from the base, and a side surface located between the top surface and the base, and at least a part of the side surface away from the display area is located between the blocking portion and the groove structure, wherein at least a part of the signal line is located in the groove structure and is covered by the blocking portion of the crack barrier structure.

19. The display device according to claim 18, wherein the signal line comprises a first electrically conductive layer and a second electrically conductive layer which are arranged in different layers, and the first electrically conductive layer is coupled to the second electrically conductive layer;

at least a part of a side surface comprised by at least one of the first electrically conductive layer or the second electrically conductive layer that is away from the display area is located between the blocking portion and the groove structure, the side surface being covered by the blocking portion.

* * * * *